United States Patent
Lee et al.

(10) Patent No.: US 8,053,984 B2
(45) Date of Patent: Nov. 8, 2011

(54) ORGANIC LIGHT EMITTING DIODE DISPLAY

(75) Inventors: Jaeyoon Lee, Seoul (KR); Choongkeun Yoo, Incheon (KR); Jongsung Kim, Gumi-si (KR); Aekyung Jeon, Uiwang-si (KR); Jongkyun Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 126 days.

(21) Appl. No.: 12/453,740

(22) Filed: May 20, 2009

(65) Prior Publication Data

US 2009/0289549 A1 Nov. 26, 2009

(30) Foreign Application Priority Data

May 26, 2008 (KR) .................. 10-2008-0048798
Oct. 30, 2008 (KR) .................. 10-2008-0107320

(51) Int. Cl.
*H05B 33/04* (2006.01)
(52) U.S. Cl. ..................... 313/512; 313/504; 445/25
(58) Field of Classification Search .......... 313/504, 313/506, 512; 445/24, 25
See application file for complete search history.

(56) References Cited

U.S. PATENT DOCUMENTS

| | | | | |
|---|---|---|---|---|
| 5,124,204 A | * | 6/1992 | Yamashita et al. | 428/331 |
| 6,146,225 A | * | 11/2000 | Sheats et al. | 445/24 |
| 6,150,187 A | * | 11/2000 | Zyung et al. | 438/26 |
| 6,624,568 B2 | * | 9/2003 | Silvernail | 313/504 |
| 6,866,901 B2 | * | 3/2005 | Burrows et al. | 428/1.5 |
| 7,208,872 B2 | * | 4/2007 | Miyadera | 313/512 |
| 7,622,862 B2 | * | 11/2009 | Mishima | 313/506 |
| 2004/0232832 A1 | * | 11/2004 | Kubota | 313/512 |
| 2007/0046199 A1 | * | 3/2007 | Lee et al. | 313/512 |
| 2007/0159096 A1 | * | 7/2007 | Oh et al. | 313/512 |
| 2008/0309235 A1 | * | 12/2008 | Yamazaki et al. | 313/512 |
| 2009/0026932 A1 | * | 1/2009 | Kwak et al. | 313/504 |
| 2009/0058293 A1 | * | 3/2009 | Maeda | 313/512 |

* cited by examiner

*Primary Examiner* — Peter Macchiarolo
*Assistant Examiner* — Mary Ellen Bowman
(74) *Attorney, Agent, or Firm* — McKenna Long & Aldridge, LLP.

(57) ABSTRACT

An organic light emitting diode (OLED) display is provided. The OLED display includes a substrate, a subpixel on the substrate, and a multi-layered protective layer covering the subpixel. The multi-layered protective layer has a structure in which organic layers and inorganic layers are alternately stacked in a repeated manner and at least one moisture absorbing layer is interposed in the multi-layered protective layer.

8 Claims, 9 Drawing Sheets

ORGANIC LIGHT EMITTING DIODE DISPLAY

This application claims the benefit of Korean Patent Application Nos. 10-2008-048798 and 10-2008-107320 respectively filed on May 26, 2008 and Oct. 30, 2008, the entire contents of which is hereby incorporated by reference.

BACKGROUND

1. Field of the Invention

This document relates to an organic light emitting diode (OLED) display.

2. Discussion of Related Art

An organic light emitting element used in an organic light emitting diode (OLED) display has a self-emission structure in which a light emitting layer is formed between two electrodes on a substrate.

The OLED display may be classified into a top emission type OLED display, a bottom emission type OLED display, and a dual emission type OLED display depending on an emitting direction of light. The OLED display may be classified into a passive matrix type OLED display and an active matrix type OLED display depending on a driving manner.

A subpixel of the OLED display includes a switching transistor, a drive transistor, a capacitor, an anode electrode, a cathode electrode, and an organic light emitting layer. Because the subpixel having the above-described structure is weak in moisture or oxygen, a multi-layered protective layer having several dozen layers is formed on the subpixel.

In a related art, a multi-layered protective layer on a subpixel is disadvantageous in a mass production aspect. However, the multi-layered protective layer can reduce the generation of a pin hole and can lengthen a traveling path of penetrating moisture to increase penetration time of moisture into a cathode electrode and an organic light emitting layer of the OLED display. In other words, the moisture penetration is delayed. Hence, life span of the related OLED display can increase.

The related art multi-layered protective layer can delay the moisture penetration, but cannot hinder the penetration of moisture. Hence, the multi-layered protective layer is not advantageous in the mass production and the life span.

SUMMARY

Accordingly, the present invention is directed to organic light emitting diode display that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic light emitting diode (OLED) display including a substrate, a subpixel on the substrate, and a multi-layered protective layer covering the subpixel, the multi-layered protective layer having a structure in which organic layers and inorganic layers are alternately stacked in a repeated manner and at least one moisture absorbing layer is interposed in the multi-layered protective layer.

In another aspect, there is an organic light emitting diode (OLED) display including a substrate, a subpixel on the substrate, and a multi-layered protective layer covering the subpixel, the multi-layered protective layer having a structure in which at least one moisture absorbing layer is interposed between inorganic layers.

It is to be understood that both the foregoing general description and the following detailed description are exemplary and explanatory and are intended to provide further explanation of the invention as claimed.

BRIEF DESCRIPTION OF THE DRAWINGS

The accompany drawings, which are included to provide a further understanding of the invention and are incorporated on and constitute a part of this specification illustrate embodiments of the invention and together with the description serve to explain the principles of the invention. In the drawing.

DETAILED DESCRIPTION

Reference will now be made in detail embodiments of the invention examples of which are illustrated in the accompanying drawings.

First Exemplary Embodiment

Figure 1:
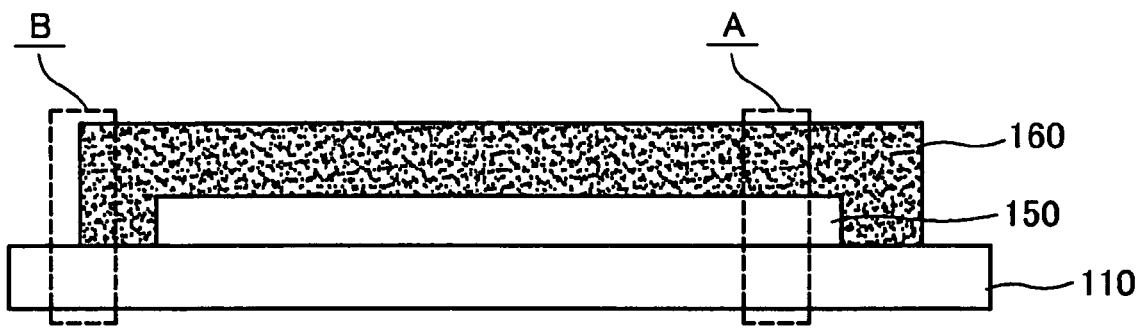
FIG. 1 is a cross-sectional view sequentially illustrating an organic light emitting diode (OLED) display according to a first exemplary embodiment of the invention.

As shown in FIG. 1, an organic light emitting diode (OLED) display according to a first exemplary embodiment of the invention may include a substrate 110, a subpixel 150 on the substrate 110, and a multi-layered protective layer 160 covering the subpixel 150. The multi-layered protective layer 160 may have a structure in which organic layers and inorganic layers are alternately stacked in a repeated manner and at least one moisture absorbing layer is interposed in the multi-layered protective layer 160.

The substrate 110 may be formed of a material that has mechanical strength or excellent dimensional stability for forming elements. The substrate 110 may be a glass substrate, a metal substrate, a ceramic substrate, or a plastic substrate. The plastic substrate may be formed of polycarbonate resin, acrylic resin, vinyl chloride resin, polyethyleneterephthalate resin, polyimide resin, polyester resin, epoxy resin, silicon resin, and fluorine resin. Other materials may be used for the substrate 110.

The subpixel 150 may include a transistor including a switching transistor, a drive transistor, and a capacitor and an organic light emitting diode on the transistor.

The subpixel 150 is described in detail below with reference to FIG. 2.

Figure 2:
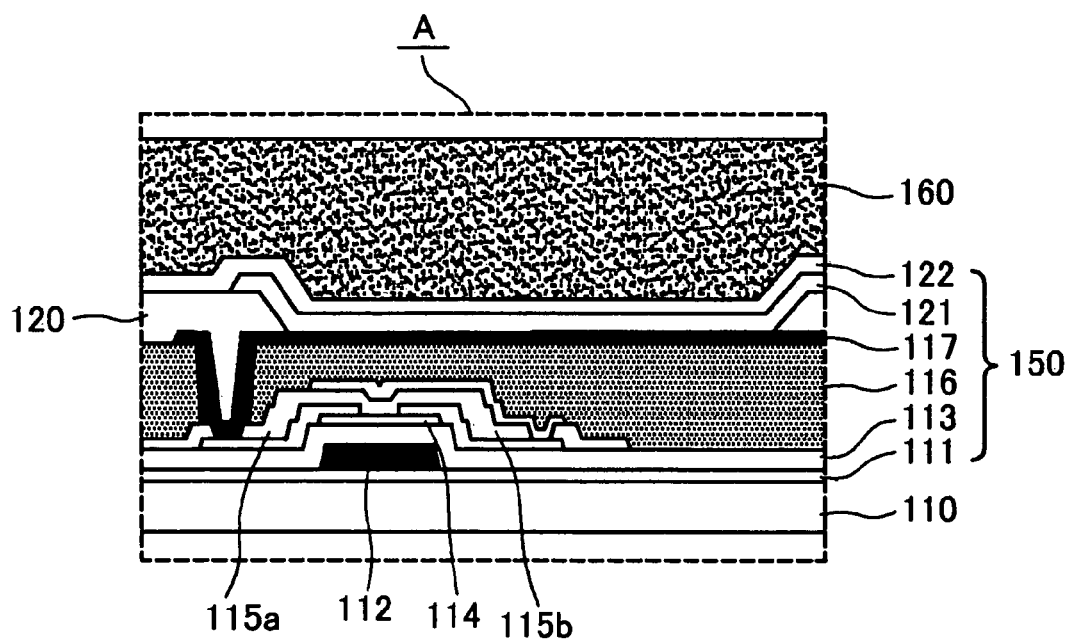
FIG. 2 is an enlarged view of a portion "A" of FIG. 1.

As shown in FIG. 2, a buffer layer 111 may be positioned on the substrate 110. The buffer layer 111 prevents impurities (e.g., alkali ions discharged from the substrate 110) from being introduced during formation of the transistor in a succeeding process. The buffer layer 111 may be formed using silicon oxide ($SiO_2$), silicon nitride ($SiN_x$), or using other materials.

A gate 112 may be positioned on the buffer layer 111. The gate 112 may be formed of molybdenum (Mo), aluminum (Al), chromium (Cr), gold (Au), titanium (Ti), nickel (Ni), neodymium (Nd) or copper (Cu), or a combination thereof. The gate 112 may have a multi-layered structure formed of Mo, Al, Cr, Au, Ti, Ni, Nd or Cu, or a combination thereof. For example, the gate 112 may have a double-layered structure including Mo/Al—Nd or Mo/Al.

A first insulating layer 113 may be positioned on the gate 112. The first insulating layer 113 may be formed of silicon oxide ($SiO_x$), silicon nitride ($SiN_x$), or a multi-layered structure or a combination thereof, but is not limited thereto.

An active layer 114 may be positioned on the first insulating layer 113. The active layer 114 may be formed of amorphous silicon or crystallized polycrystalline silicon. Although it is not shown, the active layer 114 may include a channel region, a source region, and a drain region. The source region and the drain region of the active layer 114 may be doped with p-type or n-type impurities. The active layer 114 may include an ohmic contact layer for reducing a contact resistance.

A source 115a and a drain 115b may be positioned on the active layer 114. The source 115a and the drain 115b may have a single-layered structure or a multi-layered structure. When the source 115a and the drain 115b have the single-layered structure, the source 115a and the drain 115b may be formed of Mo, Al, Cr, Au, Ti, Ni, Nd or Cu, or a combination thereof. When the source 115a and the drain 115b have the multi-layered structure, the source 115a and the drain 115b may have a double-layered structure including Mo/Al—Nd or a triple-layered structure including Mo/Al/Mo or Mo/Al—Nd/Mo.

A second insulating layer 116 may be positioned on the source 115a and the drain 115b. The second insulating layer 116 may be formed of silicon oxide ($SiO_x$), silicon nitride ($SiN_x$), or a multi-layered structure or a combination thereof. Other materials may be used. The second insulating layer 116 may be a passivation layer.

So far, the explanation of a bottom gate type transistor was given of an example of the transistor on the substrate 110. The organic light emitting diode on the transistor will be described in detail below.

A first electrode 117 may be positioned on the second insulating layer 116. The first electrode 117 may be an anode electrode and may be formed of transparent Indium-Tin-oxide (ITO) or Indium-Zinc-Oxide (IZO). Other materials may be used for the first electrode 117.

A bank layer 120 may be positioned on the first electrode 117. The bank layer 120 may be formed of an organic material such as benzocyclobutene (BCB)-based resin, acrylic resin, or polyimide resin. The bank layer 120 has an opening on the first electrode 117.

An organic light emitting layer 121 may be positioned inside the opening of the bank layer 120. The organic light emitting layer 121 may have a structure to emit one of red, green, and blue light depending on the subpixel 150.

A second electrode 122 may be positioned on the organic light emitting layer 121. The second electrode 122 may be a cathode electrode and may be formed of aluminum (Al). Other materials may be used for the second electrode 122.

The multi-layered protective layer 160 is positioned on the subpixel 150 to cover the subpixel 150.

The multi-layered protective layer 160 is described in detail below with reference to FIGS. 3 and 4.

Figure 3:
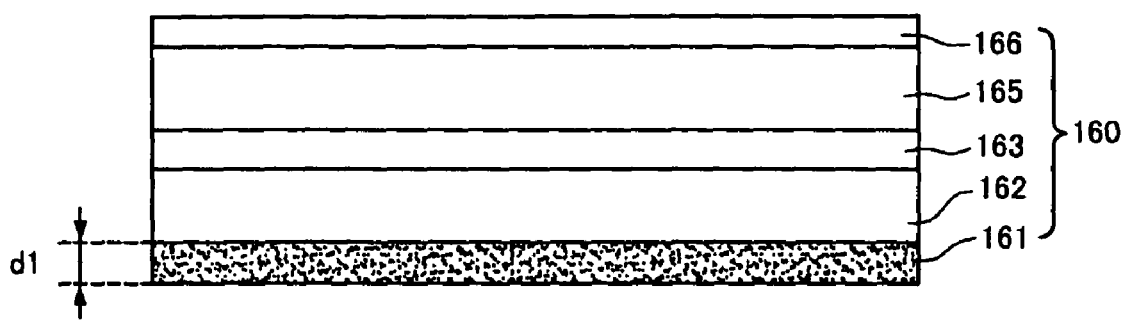
FIG. 3 illustrates an exemplary structure of a multi-layered protective layer.

As shown in FIG. 3, the multi-layered protective layer 160 has a structure in which organic layers 162 and 165 and inorganic layers 163 and 166 are alternately stacked in a repeated manner and at least one moisture absorbing layer 161 is interposed in the multi-layered protective layer 160. The moisture absorbing layer 161 may be formed through a deposition method using a mask inside a vacuum chamber. Other methods may be used.

A thickness d1 of the moisture absorbing layer 161 may be 30 □ to 500 □. When the thickness d1 of the moisture absorbing layer 161 is equal to or greater than 30 □, the moisture absorbing layer 161 can absorb moisture penetrating into the organic layers 162 and 165 and the inorganic layers 163 and 166 positioned outside the moisture absorbing layer 161. Hence, the moisture absorbing layer 161 can prevent the degradation of the subpixel 150 and a reduction in life span of the OLED display. When the thickness d1 of the moisture absorbing layer 161 is equal to or smaller than 500 □, the moisture absorbing layer 161 can more efficiently absorb moisture penetrating into the organic layers 162 and 165 and the inorganic layers 163 and 166 to the extent that a transmittance of light coming from the subpixel 150 is not reduced.

The moisture absorbing layer 161 may be formed of lithium (Li), calcium (Ca), magnesium (Mg), barium (Ba), strontium (Sr), yttrium (Y), or cesium (Cs). Other materials capable of absorbing moisture may be used.

When the moisture absorbing layer 161 is formed of Ca, the following reaction formula between Ca and moisture (i.e., $H_2O$) is obtained: $2Ca+O_2+H_2O \rightarrow Ca(OH)_2+CaO$. It can be seen from the above reaction formula that a transparent material is produced through a reaction between the moisture absorbing layer 161 and $H_2O$. Therefore, the transmittance of light coming from the subpixel 150 is not reduced.

The organic layers 162 and 165 on the moisture absorbing layer 161 may be formed of a deposition material. It is advantageous that a deposition material having a close molecule structure is used so that there is little pin hole after performing a deposition process.

The inorganic layers 163 and 166 on the organic layers 162 and 165 may be formed of $Al_2O_3$, SiNx, $SiO_2$, SiON, or SiC. Other materials may be used.

Figure 4:
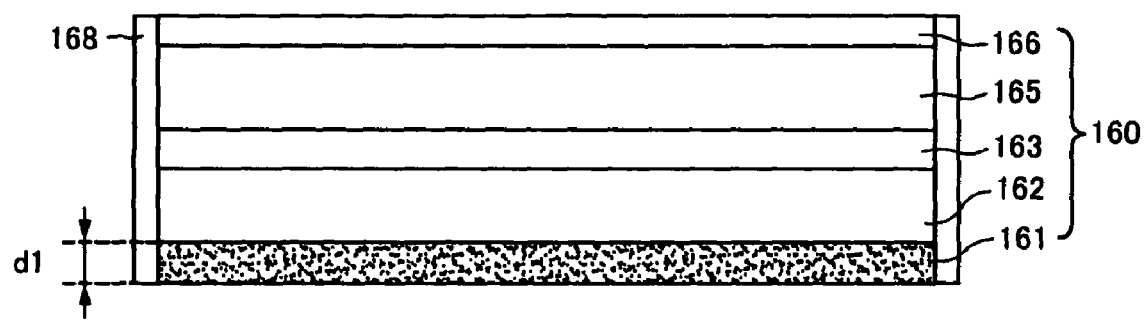
FIG. 4 illustrates another exemplary structure of a multi-layered protective layer.

As shown in FIG. 4, an edge portion of the multi-layered protective layer 160 may be sealed with an inorganic barrier rib 168. The inorganic barrier rib 168 may be formed of the same material as the inorganic layers 163 and 166, for example, $Al_2O_3$, SiNx, $SiO_2$, SiON, or SiC. Other materials may be used. The inorganic barrier rib 168 may prevent moisture from penetrating into the side of the multi-layered protective layer 160, which is relatively thinner than other portions of the multi-layered protective layer 160.

As shown in FIGS. 3 and 4, thicknesses of the organic layers 162 and 165 may be greater than thicknesses of the inorganic layers 163 and 166 or the thickness d1 of the moisture absorbing layer 161. Hence, a penetration path of moisture may lengthen while maintaining a flexibility of the OLED display.

Figure 5:
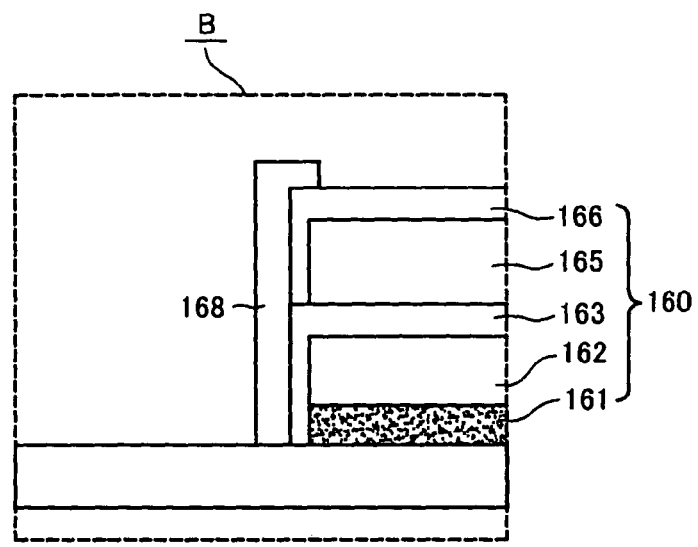
FIG. 5 is an enlarged view of a portion "B" of FIG. 1.

As shown in FIG. 5, an edge portion of the moisture absorbing layer 161 may be positioned more inward than edge portions of the inorganic layers 163 and 166. Because the edge portion of the multi-layered protective layer 160 is thinner than an upper portion of the multi-layered protective layer 160, the edge portion of the moisture absorbing layer 161 is positioned more inward than the edge portions of the inorganic layers 163 and 166 so that the thin edge portion of the multi-layered protective layer 160 is strengthened.

FIG. 5 shows that a length of edge portions of the organic layers 162 and 165 is similar to a length of the edge portion of the moisture absorbing layer 161. However, the organic layers 162 and 165 may be positioned more outwardly than the moisture absorbing layer 161.

FIG. 5 shows that the inorganic barrier rib 168 sealing the edge portion of the multi-layered protective layer 160 covers and seals a portion of the inorganic layer 166 positioned at an uppermost location of the multi-layered protective layer 160. However, the inorganic barrier rib 168 may cover and seal a portion of any one layer included in the multi-layered protective layer 160.

Second Exemplary Embodiment

Figure 6:
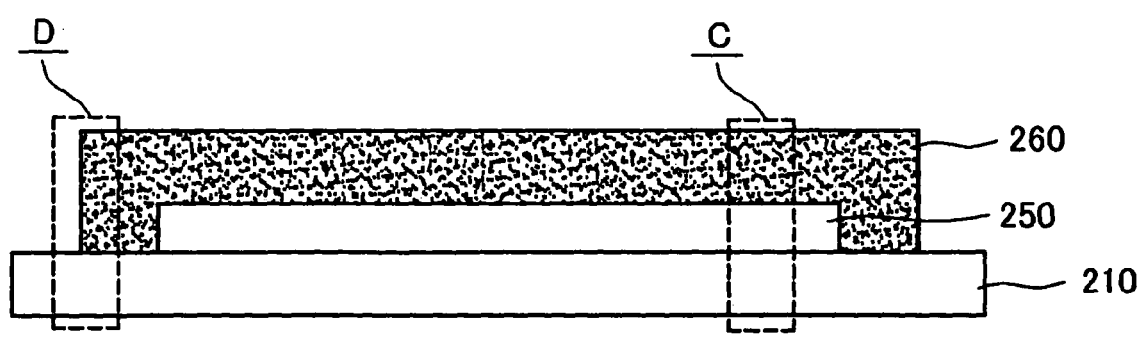
FIG. 6 is a cross-sectional view sequentially illustrating an OLED display according to a second exemplary embodiment of the invention.

As shown in FIG. 6, an OLED display according to a second exemplary embodiment of the invention may include a substrate 210, a subpixel 250 on the substrate 210, and a multi-layered protective layer 260 covering the subpixel 250. The multi-layered protective layer 260 may have a structure in which organic layers and inorganic layers are alternately stacked in a repeated manner and at least one moisture absorbing layer is interposed in the multi-layered protective layer 260.

The substrate 210 may be formed of a material that has mechanical strength or excellent dimensional stability for forming elements. The substrate 210 may be a glass substrate, a metal substrate, a ceramic substrate, or a plastic substrate. The plastic substrate may be formed of polycarbonate resin, acrylic resin, vinyl chloride resin, polyethyleneterephthalate resin, polyimide resin, polyester resin, epoxy resin, silicon resin, and fluorine resin. Other materials may be used for the substrate 210.

The subpixel 250 may include a transistor including a switching transistor, a drive transistor, and a capacitor and an organic light emitting diode on the transistor.

The subpixel 250 is described in detail below with reference to FIG. 7.

Figure 7:
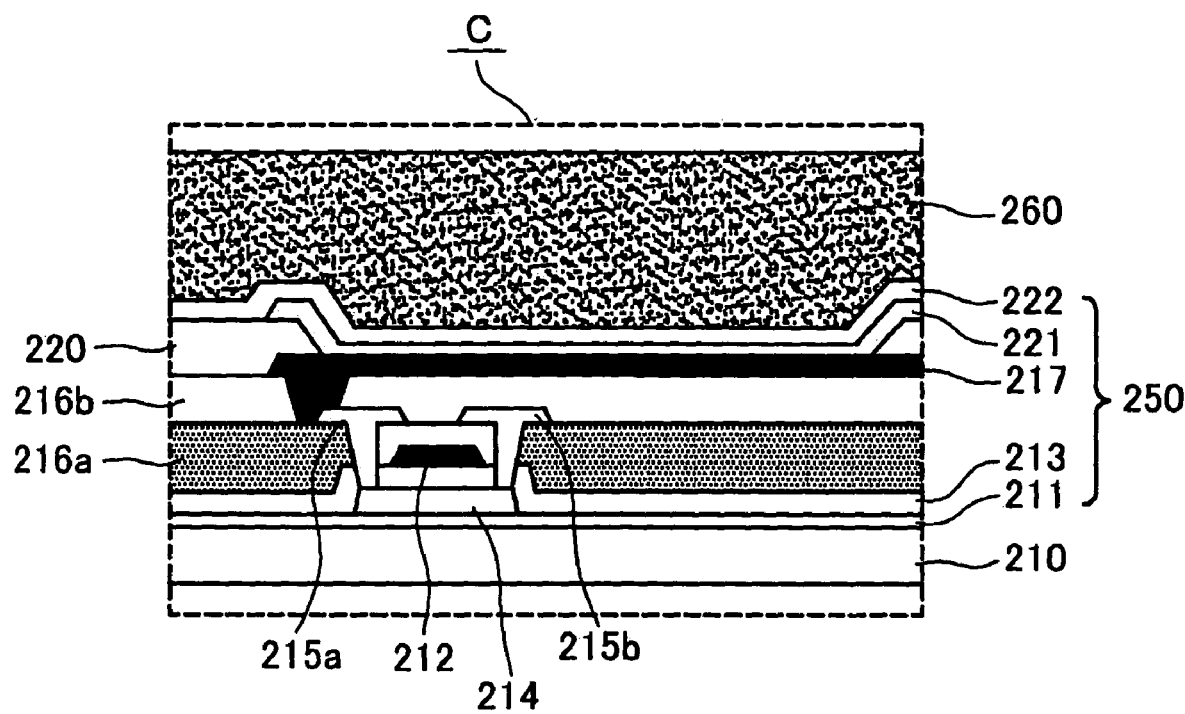
FIG. 7 is an enlarged view of a portion "C" of FIG. 6.

As shown in FIG. 7, a buffer layer 211 may be positioned on the substrate 210. The buffer layer 211 prevents impurities (e.g., alkali ions discharged from the substrate 210) from being introduced during formation of the transistor in a succeeding process. The buffer layer 211 may be formed using silicon oxide ($SiO_2$), silicon nitride ($SiN_x$), or using other materials.

An active layer 214 may be positioned on the buffer layer 211. The active layer 214 may be formed of amorphous silicon or crystallized polycrystalline silicon. Although it is not shown, the active layer 214 may include a channel region, a source region, and a drain region. The source region and the drain region of the active layer 214 may be doped with p-type or n-type impurities. The active layer 214 may include an ohmic contact layer for reducing a contact resistance.

A first insulating layer 213 may be positioned on the active layer 214. The first insulating layer 213 may be formed of silicon oxide ($SiO_x$), silicon nitride ($SiN_x$), or a multi-layered structure or a combination thereof, but is not limited thereto.

A gate 212 may be positioned on the first insulating layer 213. The gate 212 may be formed of molybdenum (Mo), aluminum (Al), chromium (Cr), gold (Au), titanium (Ti), nickel (Ni), neodymium (Nd) or copper (Cu), or a combination thereof. The gate 212 may have a multi-layered structure formed of Mo, Al, Cr, Au, Ti, Ni, Nd, or Cu, or a combination thereof. For example, the gate 212 may have a double-layered structure including Mo/Al—Nd or Mo/Al.

A second insulating layer 216a may be positioned on the gate 212. The second insulating layer 216a may be formed of silicon oxide ($SiO_x$), silicon nitride ($SiN_x$), or a multi-layered structure or a combination thereof. Other materials may be used. The second insulating layer 216a may be a passivation layer.

A source 215a and a drain 215b contacting the active layer 214 may be positioned on the second insulating layer 216a. The source 215a and the drain 215b may have a single-layered structure or a multi-layered structure. When the source 215a and the drain 215b have the single-layered structure, the source 215a and the drain 215b may be formed of Mo, Al, Cr, Au, Ti, Ni, Nd, or Cu, or a combination thereof. When the source 215a and the drain 215b have the multi-layered structure, the source 215a and the drain 215b may have a double-layered structure including Mo/Al—Nd or a triple-layered structure including Mo/Al/Mo or Mo/Al—Nd/Mo.

A third insulating layer 216b may be positioned on the source 215a and the drain 215b. The third insulating layer 116b may be formed of an organic material or an inorganic material. The third insulating layer 116b may be a planarization layer for increasing a planarization level.

So far, the transistor on the substrate 210 was described. The organic light emitting diode on the transistor will be described in detail below.

A first electrode 217 connected to the source 215a and the drain 215b may be positioned on the third insulating layer 216b. The first electrode 217 may be an anode electrode and may be formed of transparent Indium-Tin-oxide (ITO) or Indium-Zinc-Oxide (IZO). Other materials may be used for the first electrode 217.

A bank layer 220 may be positioned on the first electrode 217. The bank layer 220 may be formed of an organic material such as benzocyclobutene (BCB)-based resin, acrylic resin, or polyimide resin. The bank layer 220 has an opening on the first electrode 217.

An organic light emitting layer 221 may be positioned inside the opening of the bank layer 220. The organic light emitting layer 221 may have a structure to emit one of red, green, and blue light in which depending on the subpixel 250.

A second electrode 222 may be positioned on the organic light emitting layer 221. The second electrode 222 may be a cathode electrode and may be formed of aluminum (Al). Other materials may be used for the second electrode 222.

The multi-layered protective layer 260 is positioned on the subpixel 250 to cover the subpixel 250.

The multi-layered protective layer 260 is described in detail below with reference to FIGS. 8 and 9.

Figure 8:
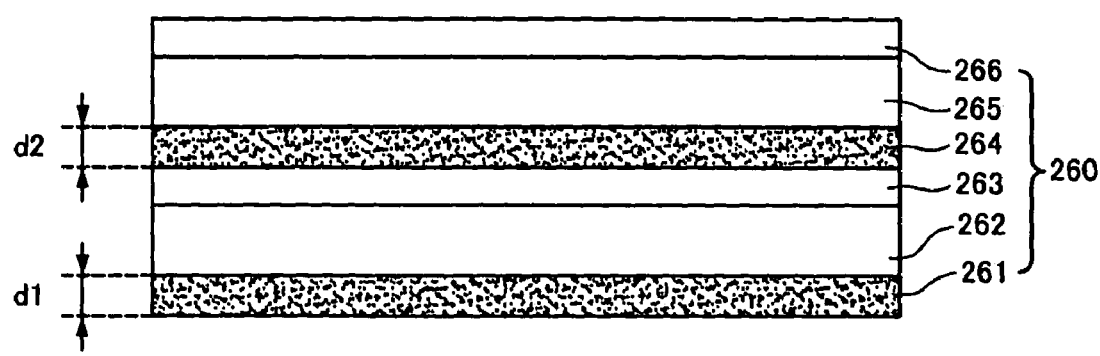
FIG. 8 illustrates an exemplary structure of a multi-layered protective layer.

As shown in FIG. 8, the multi-layered protective layer 260 may have a structure in which a moisture absorbing layer 261, an organic layer 262, an inorganic layer 263, a moisture absorbing layer 264, an organic layer 265, and an inorganic layer 266 are stacked in the order named. The moisture absorbing layers 261 and 264 may be formed through a deposition method using a mask inside a vacuum chamber. Other methods may be used.

Thicknesses d1 and d2 of the moisture absorbing layers 261 and 264 may be 30 Å to 500 Å. When the thicknesses d1 and d2 of the moisture absorbing layers 261 and 264 are equal to or greater than 30 Å, the moisture absorbing layers 261 and 264 can absorb moisture penetrating into the organic layers 262 and 265 and the inorganic layers 263 and 266 positioned outside the moisture absorbing layers 261 and 264. Hence, the moisture absorbing layers 261 and 264 can prevent the degradation of the subpixel 250 and a reduction in life span of the OLED display. When the thicknesses d1 and d2 of the moisture absorbing layers 261 and 264 are equal to or smaller than 500 Å, the moisture absorbing layers 261 and 264 can more efficiently absorb moisture penetrating into the OLED display through the organic layers 262 and 265 and the inorganic layers 263 and 266 to the extent that a transmittance of light coming from the subpixel 250 is not reduced.

The moisture absorbing layers 261 and 264 may be formed of lithium (Li), calcium (Ca), magnesium (Mg), barium (Ba), strontium (Sr), yttrium (Y), or cesium (Cs). Other materials capable of absorbing moisture may be used.

When the moisture absorbing layers 261 and 264 is formed of Ca, the following reaction formula between Ca and moisture (i.e., $H_2O$) is obtained: $2Ca+O_2+H_2O \rightarrow Ca(OH)_2+CaO$. It can be seen from the above reaction formula that a transparent material is produced through a reaction between the moisture absorbing layers 261 and 264 and $H_2O$. Therefore, the transmittance of light coming from the subpixel 250 is not reduced.

The organic layers 262 and 265 on the moisture absorbing layers 261 and 264 may be formed of a deposition material. It is advantageous that a deposition material having a close molecule structure is used so that there is little pin hole after performing a deposition process.

The inorganic layers 263 and 266 on the organic layers 262 and 265 may be formed of $Al_2O_3$, SiNx, $SiO_2$, SiON, or SiC. Other materials may be used.

Figure 9:
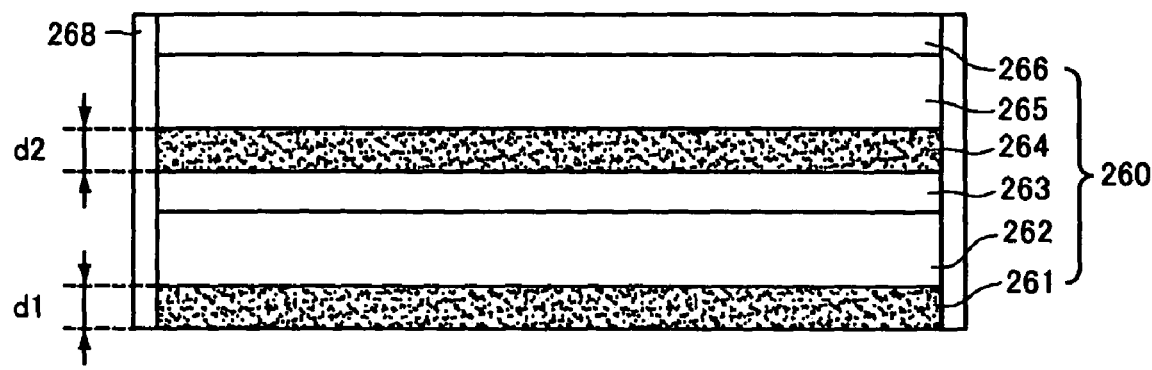
FIG. 9 illustrates another exemplary structure of a multi-layered protective layer.

As shown in FIG. 9, in the multi-layered protective layer 260, the moisture absorbing layer 261, the organic layer 262, the inorganic layer 263, the moisture absorbing layer 264, the organic layer 265, and the inorganic layer 266 are stacked in the order named. An edge portion of the multi-layered protective layer 260 may be sealed with an inorganic barrier rib 268. The inorganic barrier rib 268 may prevent moisture from penetrating into the side of the multi-layered protective layer 260, which is relatively thinner than other portions of the multi-layered protective layer 260. The inorganic barrier rib 268 may be formed of the same material as the inorganic layers 263 and 266, for example, $Al_2O_3$, SiNx, $SiO_2$, SiON, or SiC. Other materials may be used.

As shown in FIGS. 8 and 9, thicknesses of the organic layers 262 and 265 may be greater than thicknesses of the inorganic layers 263 and 266 or the thicknesses d1 and d2 of the moisture absorbing layers 261 and 264. Hence, a penetration path of moisture may lengthen while maintaining a flexibility of the OLED display.

The thickness d1 of the moisture absorbing layer 261 may be different from the thickness d2 of the moisture absorbing layer 264. For example, the thickness d1 of the moisture absorbing layer 261 may be smaller than the thickness d2 of the moisture absorbing layer 264 so as to increase a transmittance of light coming from the subpixel 250. The thickness d2 of the moisture absorbing layer 264 may be smaller than the thickness d1 of the moisture absorbing layer 261, if necessary.

Figure 10:
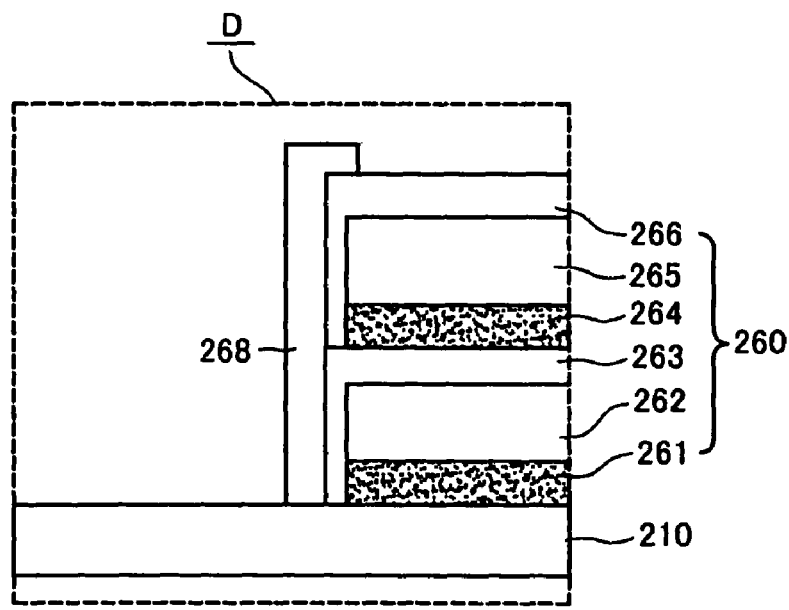
FIG. 10 is an enlarged view of a portion "D" of FIG. 6.

As shown in FIG. 10, edge portions of the moisture absorbing layers 261 and 264 may be positioned more inward than edge portions of the inorganic layers 263 and 266. Because the edge portion of the multi-layered protective layer 260 is thinner than an upper portion of the multi-layered protective layer 260, the edge portions of the moisture absorbing layers 261 and 264 are positioned more inward than the edge portions of the inorganic layers 263 and 266 so that the thin edge portion of the multi-layered protective layer 260 is strengthened.

FIG. 10 shows that a length of edge portions of the organic layers 262 and 265 is similar to a length of the edge portions of the moisture absorbing layers 261 and 264. However, the organic layers 262 and 265 may be positioned more outwardly than the moisture absorbing layers 261 and 264.

FIG. 10 shows that the inorganic barrier rib 268 sealing the edge portion of the multi-layered protective layer 260 covers and seals a portion of the inorganic layer 266 positioned at an uppermost location of the multi-layered protective layer 260. However, the inorganic barrier rib 268 may cover and seal a portion of any one layer included in the multi-layered protective layer 260.

Third Exemplary Embodiment

Figure 11:
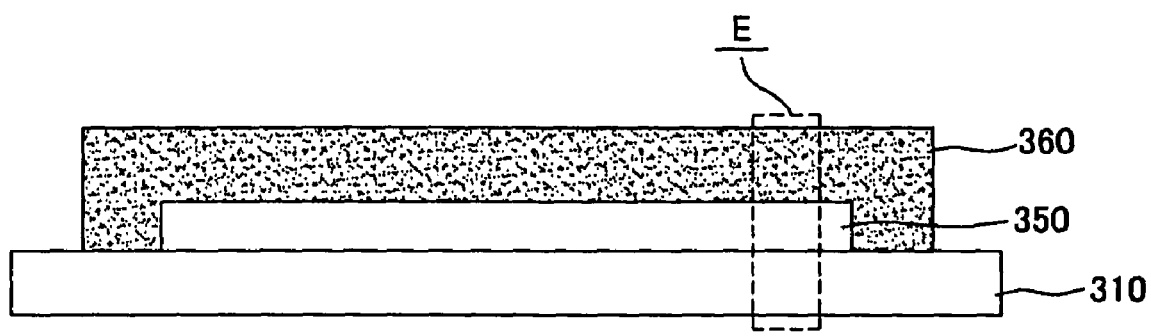
FIG. 11 is a cross-sectional view sequentially illustrating an OLED display according to a third exemplary embodiment of the invention.

As shown in FIG. 11, an OLED display according to a third exemplary embodiment of the invention may include a substrate 310, a subpixel 350 on the substrate 310, and a multi-layered protective layer 360 covering the subpixel 350. The multi-layered protective layer 360 may have a structure in which at least one moisture absorbing layer is interposed between inorganic layers.

The subpixel 350 may include a transistor including a switching transistor, a drive transistor, and a capacitor and an organic light emitting diode on the transistor.

Figure 12:
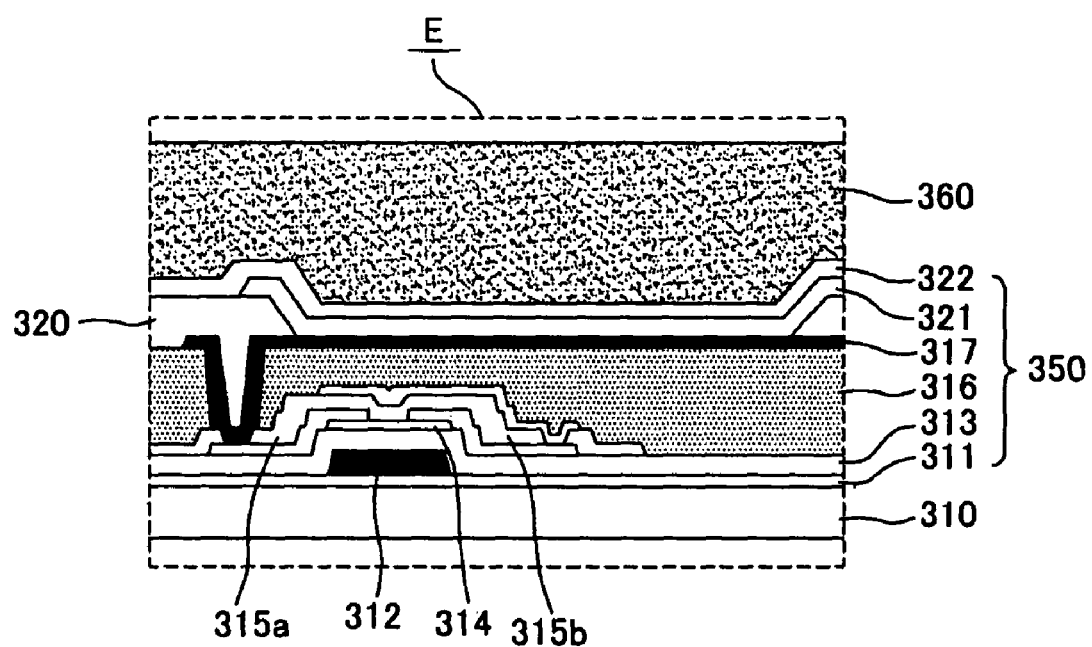
FIG. 12 is an enlarged view of a portion "E" of FIG. 11.

Since a structure of the subpixel 350 shown in FIG. 12 is substantially the same as the subpixel 150 shown in FIG. 2, a further description may be briefly made or may be entirely omitted. The multi-layered protective layer 360 is positioned on the subpixel 350 to cover the subpixel 350.

The multi-layered protective layer 360 is described in detail below with reference to FIGS. 13 and 14.

Figure 13:
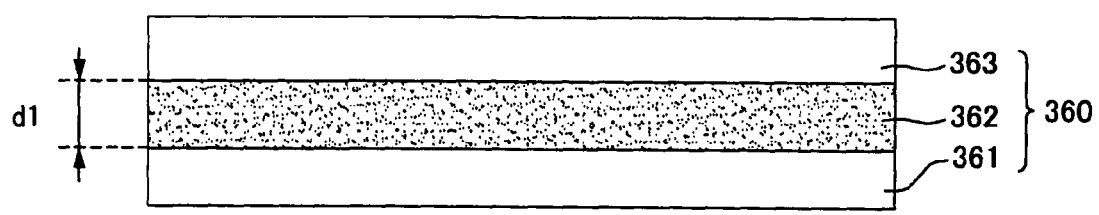
FIG. 13 illustrates an exemplary structure of a multi-layered protective layer.

As shown in FIG. 13, the multi-layered protective layer 360 has a structure in which at least one or more moisture absorbing layer 362 is interposed between inorganic layers 361 and 363. The moisture absorbing layer 362 may be formed using one of a dipping method, a spin coating method, a spray coating method, a dispensing method, and a screen printing method depending on a formation material of the moisture absorbing layer 362. Other methods may be used.

A thickness d1 of the moisture absorbing layer 362 may be 0.05 μm to 1,000 μm When the thickness d1 of the moisture absorbing layer 362 is equal to or greater than 0.05 μm the moisture absorbing layer 362 can absorb moisture or oxygen penetrating into the inorganic layers 361 and 363 surrounding the moisture absorbing layer 362. Hence, the moisture absorbing layer 362 can prevent the degradation of the subpixel 350 and a reduction in life span of the OLED display. When the thickness d1 of the moisture absorbing layer 362 is equal to or smaller than 1,000 m the moisture absorbing layer 362 can more efficiently absorb moisture or oxygen penetrating into the inorganic layers 361 and 363 surrounding the moisture absorbing layer 362 to the extent that a transmittance of light coming from the subpixel 350 is not reduced.

The moisture absorbing layer 362 may be formed of polyvinyl alcohol or an organic metal compound. If the moisture absorbing layer 362 contains an adhesive material, the moisture absorbing layer 362 may be attached to the inorganic layer 361 using the adhesive material. If the moisture absorbing layer 362 does not contain an adhesive material, the moisture absorbing layer 362 may be attached to the inorganic layer 361 by applying heat to the moisture absorbing layer 362 and drawing the moisture absorbing layer 362.

When the moisture absorbing layer 362 is formed of the organic metal compound, the organic metal compound may be a compound expressed by the following formula: M(OR1)a. In the above formula, M is one of group I, III, and IV elements, R1 is one of substituted or non-substituted mono-valent chain hydrocarbon group, mono-valent alicyclic hydrocarbon group, and monocyclic or polycyclic mono-valent aromatic or hetero aromatic hydrocarbon group, "a" is 2 when M is a group II element, "a" is 3 when M is a group III element, and "a" is 4 when M is a group IV element.

In a process for forming the moisture absorbing layer 362, when an organic metal compound solution is deposited on the subpixel and then a condensing agent is produced using at least one of heat or ultraviolet rays, the moisture absorbing layer 362 may contain at least one of the following (1) and (2). (1) may include at least one of zeolite capable of absorbing $H_2O$, silica, alumina, alkali metal oxide, alkaline earth metal oxide, nickel zinc cadmium oxide, chloride, perchlorate, sulfate, epoxide, luis, a compound for producing positive carbon ions, alkoxide, and acyl halide. (2) may include at least one of alkali metal capable of absorbing $O_2$, alkaline earth metal, iron oxide, tin oxide, copper oxide, manganese oxide, phosphit, salt having negative phosphit ions, phenol, secondary aromatic amine. thioethers, and aldehyde. Each of particles of metal included in (1) or (2) has the size of 10 nm to 500 nm.

In the process for forming the moisture absorbing layer 362 using the organic metal compound solution, a base material (i.e., moisture transfer layer) of an organic binder may use at least one of polyacrylate, polymethacrylate, polyether imide (PEI), polyamide (PA), cellulose acetate (CA), cellulose triacetate (TCA), polysiloxane, polyvinyl alcohol (PVA), polyethylene oxide (PEO), polyethylene glycol (PEG), polypropylene glycol (PPG), polyvinyl acetate (PVAC), polyoxymethylene (POM), poly (ethylene vinyl alcohol) copolymer (EVAL, EVOH), poly (amide-ekylene oxide) copolymer (PA-PEO), poly (urethane-ethylene oxide) copolymer (PUR-PEO), poly (ekylene-vinyl acetate) copolymer (EVA, EVAC). A solvent may use a polar solvent such as an alcohol-based solvent and a ketone-based solvent, or a non-polar solvent such as aromatic hydrocarbon, alicyclic hydrocarbon, and alicyclic hydrocarbon-based organic solvent.

As described above, in the process for forming the moisture absorbing layer 362 using the organic metal compound solution, a thermal process is performed on a coated thin film to produce a condensing agent. The condensing agent may perform a stress reduction and absorption and removal of an external gas.

The inorganic layers 361 and 363 may be formed on the subpixel 350 using one of a chemical vapor deposition (CVD) method, a sputtering method, and an evaporation method depending on a material of the inorganic layers 361 and 363. Other methods may be used. The inorganic layers 361 and 363 may be formed of inorganic oxide or inorganic nitride. For example, the inorganic layers 361 and 363 may be formed of one of $SiO_2$, $SiOxNy$, $SiNx$, $SiOxCy$, $Al_2O_3$, ITO, ZnOx, and Al—ZnOx. Other materials may be used.

Figure 14:
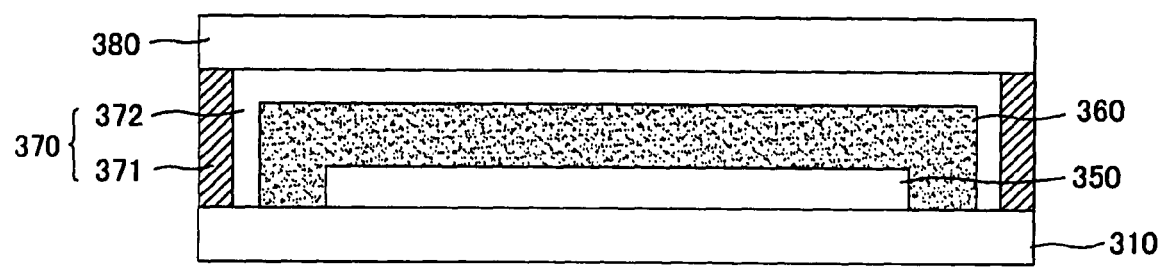
FIG. 14 illustrates another exemplary structure of a multi-layered protective layer.

As shown in FIG. 14, the OLED display thus formed may further include a sealing substrate 380 for sealing the subpixel 350. The sealing substrate 380 may be positioned opposite the substrate 310 to be spaced apart from the substrate 310. The substrate 310 and the sealing substrate 380 may be sealed with an adhesive member 370. The adhesive member 370 may include a first adhesive member 371 positioned outside the substrate 310 and the sealing substrate 380 and a second adhesive member 372 that is positioned more inward than the first adhesive member 371 in front of the substrate 310 and the sealing substrate 380. An edge sealant may be used as the first adhesive member 371, and a transparent front sealant may be used as the second adhesive member 372. Other materials may be used for the first and second adhesive members 371 and 372.

Fourth Exemplary Embodiment

Figure 15:
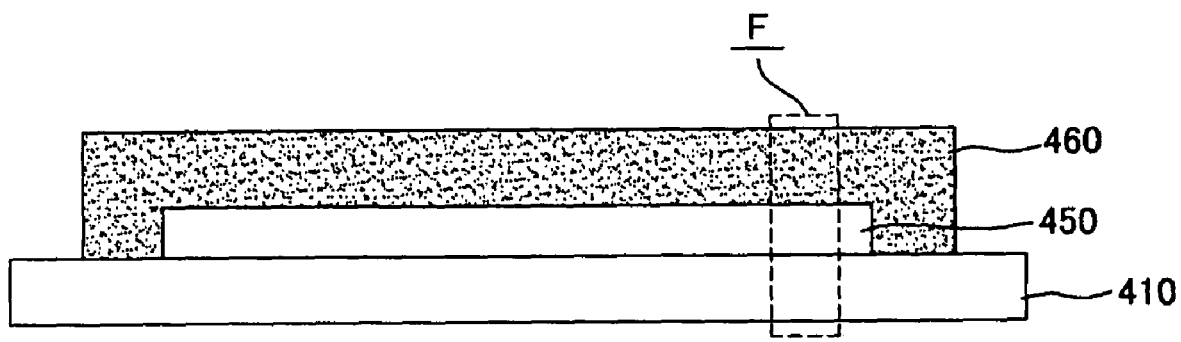
FIG. 15 is a cross-sectional view sequentially illustrating an OLED display according to a fourth exemplary embodiment of the invention.

As shown in FIG. 15, an OLED display according to a fourth exemplary embodiment of the invention may include a substrate 410, a subpixel 450 on the substrate 410, and a multi-layered protective layer 460 covering the subpixel 450. The multi-layered protective layer 460 may have a structure in which at least one or more moisture absorbing layer is interposed between inorganic layers. The multi-layered protective layer 460 may include at least two inorganic layers and at least two moisture absorbing layers.

The subpixel 450 may include a transistor including a switching transistor, a drive transistor, and a capacitor and an organic light emitting diode on the transistor.

Figure 16:
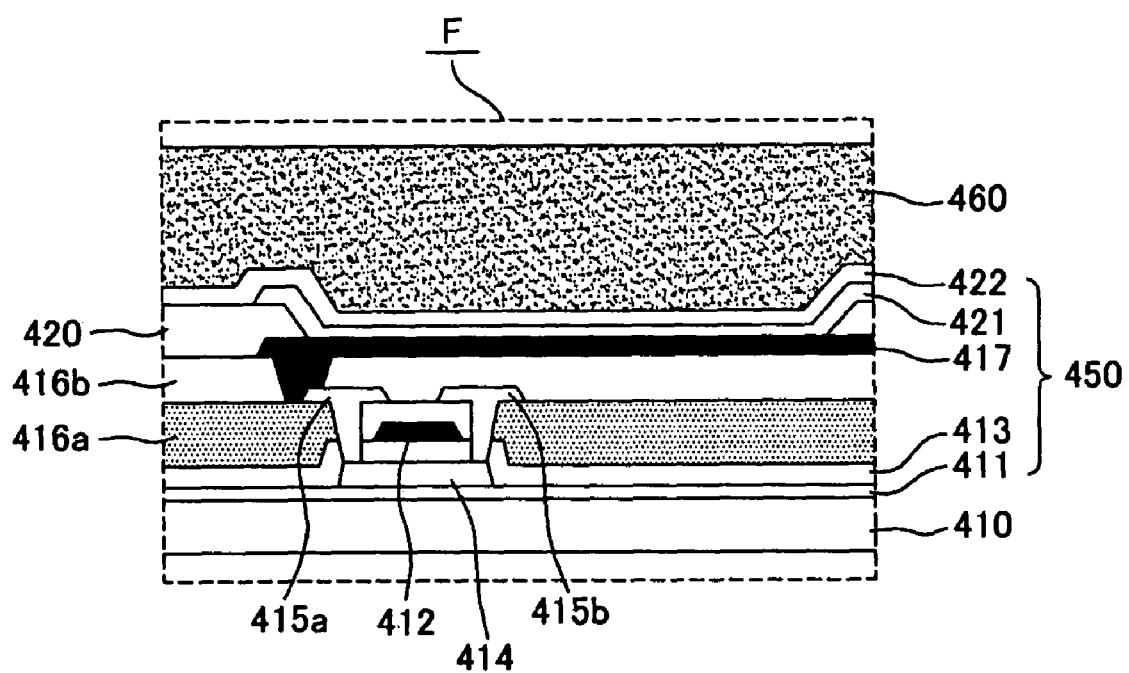
FIG. 16 is an enlarged view of a portion "F" of FIG. 15.

Since a structure of the subpixel 450 shown in FIG. 16 is substantially the same as the subpixel 250 shown in FIG. 7, a further description may be briefly made or may be entirely omitted. The multi-layered protective layer 460 is positioned on the subpixel 450 to cover the subpixel 450.

The multi-layered protective layer 460 is described in detail below with reference to FIGS. 17 and 18.

Figure 17:
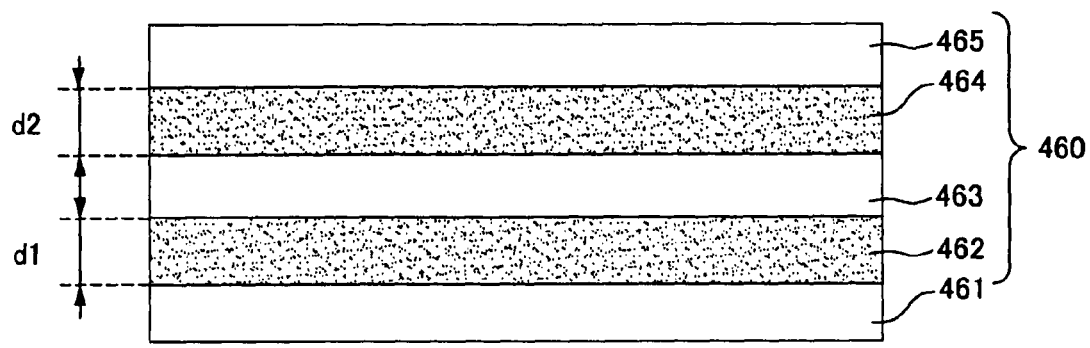
FIG. 17 illustrates an exemplary structure of a multi-layered protective layer.
Figure 18:
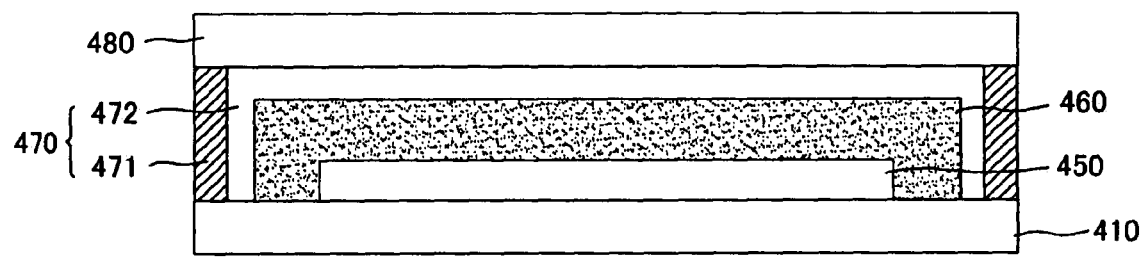
FIG. 18 illustrates another exemplary structure of a multi-layered protective layer.

As shown in FIG. 17, the multi-layered protective layer 460 has a structure in which the inorganic layers and the moisture absorbing layers are alternately stacked in a repeated manner. More specifically, the multi-layered protective layer 460 has a structure in which an inorganic layer 461, a moisture absorbing layer 462, an inorganic layer 463, a moisture absorbing layer 464, and an inorganic layer 465 are stacked in the order named.

The moisture absorbing layers 462 and 464 may be formed using one of a dipping method, a spin coating method, a spray coating method, a dispensing method, and a screen printing method depending on a formation material. Other methods may be used.

Thicknesses d1 and d2 of the moisture absorbing layers 462 and 464 may be 0.05 μm to 1,000 μm When the thicknesses d1 and d2 of the moisture absorbing layers 462 and 464 are equal to or greater than 0.05 μm the moisture absorbing layer 462 can absorb moisture or oxygen penetrating into the inorganic layers 461, 463, and 465 surrounding the moisture absorbing layers 462 and 464. Hence, the moisture absorbing layers 462 and 464 can prevent the degradation of the subpixel 450 and a reduction in life span of the OLED display. When the thicknesses d1 and d2 of the moisture absorbing layers 462 and 464 are equal to or smaller than 1,000 μm the moisture absorbing layer 462 can more efficiently absorb moisture or oxygen penetrating into the inorganic layers 461, 463, and 465 surrounding the moisture absorbing layers 462 and 464 to the extent that a transmittance of light coming from the subpixel 450 is not reduced.

The moisture absorbing layers 462 and 464 may be formed of polyvinyl alcohol or an organic metal compound. If the moisture absorbing layers 462 and 464 contain an adhesive material, the moisture absorbing layers 462 and 464 may be attached to the inorganic layers 461 and 463 using the adhesive material. If the moisture absorbing layers 462 and 464 do not contain an adhesive material, the moisture absorbing layers 462 and 464 may be attached to the inorganic layers 461 and 463 by applying heat to the moisture absorbing layers 462 and 464 and drawing the moisture absorbing layers 462 and 464.

The thickness d1 of the moisture absorbing layer 462 may be equal to or different from the thickness d2 of the moisture absorbing layer 464. For example, the thickness d1 of the moisture absorbing layer 462 may be smaller than the thickness d2 of the moisture absorbing layer 464 in consideration of an amount of moisture or oxygen penetrating from the outside.

When the moisture absorbing layers 462 and 464 are formed of the organic metal compound, the organic metal compound may be a compound expressed by the following formula: M(OR1)a. In the above formula, M is one of group I, III, and IV elements, R1 is one of substituted or non-substituted mono-valent chain hydrocarbon group, mono-valent alicyclic hydrocarbon group, and monocyclic or polycyclic mono-valent aromatic or hetero aromatic hydrocarbon group, "a" is 2 when M is a group II element, "a" is 3 when M is a group III element, and "a" is 4 when M is a group IV element.

a process for forming the moisture absorbing layers 462 and 464, when an organic metal compound solution is deposited on the subpixel and then a condensing agent is produced using at least one of heat or ultraviolet rays, the moisture absorbing layers 462 and 464 may contain at least one of the following (1) and (2). (1) may include at least one of zeolite capable of absorbing $H_2O$, silica, alumina, alkali metal oxide, alkaline earth metal oxide, nickel zinc cadmium oxide, chloride, perchlorate, sulfate, epoxide, luis, a compound for producing positive carbon ions, alkoxide, and acyl halide. (2) may include at least one of alkali metal capable of absorbing $O_2$, alkaline earth metal, iron oxide, tin oxide, copper oxide, manganese oxide, phosphit, salt having negative phosphit ions, phenol, secondary aromatic amine, thioethers, and aldehyde. Each of particles of metal included in (1) or (2) has the size of 10 nm to 500 nm.

In the process for forming the moisture absorbing layers 462 and 464 using the organic metal compound solution, a base material (i.e., a moisture transfer layer) of an organic binder may use at least one of polyacrylate, polymethacrylate, polyether imide (PEI), polyamide (PA), cellulose acetate (CA), cellulose triacetate (TCA), polysiloxane, polyvinyl alcohol (PVA), polyethylene oxide (PEO), polyethylene glycol (PEG), polypropylene glycol (PPG), polyvinyl acetate (PVAC), polyoxymethylene (POM), poly (ethylene vinyl alcohol) copolymer (EVAL, EVOH), poly (amide-ekylene oxide) copolymer (PA-PEO), poly (urethane-ethylene oxide) copolymer (PUR-PEO), poly ekylene-vinyl acetate) copolymer (EVA, EVAC). A solvent may use a polar solvent such as an alcohol-based solvent and a ketone-based solvent, or a non-polar solvent such as aromatic hydrocarbon, alicyclic hydrocarbon, and alicyclic hydrocarbon-based organic solvent.

As described above, in the process for forming the moisture absorbing layer 462 using the organic metal compound solution, a thermal process is performed on a coated thin film to produce a condensing agent. The condensing agent may perform a stress reduction and absorption and removal of an external gas.

The inorganic layers 461, 463, and 465 may be formed on the subpixel 450 using one of a CVD method, a sputtering method, and an evaporation method depending on a formation material of the inorganic layers 461, 463, and 465. Other methods may be used. The inorganic layers 461, 463, and 465 may be formed of inorganic oxide or inorganic nitride. For example, the inorganic layers 461, 463, and 465 may be formed of one of $SiO_2$, SiOxNy, SiNx, SiOxCy, $Al_2O_3$, ITO, ZnOx, and Al—ZnOx. Other materials may be used.

As described above, in the OLED display according to the embodiments of the invention, the degradation of elements of the OLED display can be prevented and life span of the OLED display can increase through the multi-layered protective layer including the moisture absorbing layer. Furthermore, the OLED display according to the embodiments of the invention can achieve mass production as well as an increase in the life span. The OLED display according to the embodiments of the invention can minimize a generation percentage of particles capable of causing a defect of the OLED display during a manufacturing process and can provide a flexibility.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting diode (OLED) display comprising:
   a substrate;
   a subpixel on the substrate;
   a multi-layered protective layer covering the subpixel, the multi-layered protective layer having a structure in which organic layers and inorganic layers are alternately stacked in a repeated manner and at least one moisture absorbing layer is interposed in the multi-layered protective layer; and
   an inorganic barrier rib formed only at an edge portion of the substrate to cover an edge portion of the multi-layered protective layer,
   wherein the multi-layered protective layer has a structure in which a first moisture absorbing layer, a first organic layer, a first inorganic layer, a second moisture absorbing layer, a second organic layer, and a second inorganic layer are stacked in the order named, wherein a thickness of the moisture absorbing layer is 30 Å to 500 Å, wherein thicknesses of the two moisture absorbing layers are different from each other, wherein a thickness of the organic layer is greater than a thickness of the inorganic layer or a thickness of the moisture absorbing layer.

2. The OLED display of claim 1, wherein the moisture absorbing layer is formed of lithium (Li), calcium (Ca), magnesium (Mg), barium (Ba), strontium (Sr), yttrium (Y), or cesium (Cs).

3. The OLED display of claim 1, wherein the inorganic layers are formed of Al2O3, SiNx, SiO2, SiON, or SiC.

4. The OLED display of claim 1, wherein an edge portion of the moisture absorbing layer is positioned more inward than edge portions of the inorganic layers.

5. The OLED display of claim 1, wherein the moisture absorbing layer is formed through a deposition method using a mask inside a vacuum chamber.

6. An organic light emitting diode (OLED) display comprising:
a substrate;
a subpixel on the substrate;
a multi-layered protective layer covering the subpixel, the multi-layered protective layer having a structure in which at least one moisture absorbing layer is interposed between inorganic layers,
an inorganic barrier rib formed only at an edge portion of the substrate to cover an edge portion of the multi-layered protective layer; and
a sealing substrate for covering the multi-layered protective layer, the sealing substrate being positioned opposite the substrate to be spaced apart from the substrate,
wherein the substrate and the sealing substrate are sealed with an adhesive member,
wherein the adhesive member includes a first adhesive member positioned outside the substrate and the sealing substrate and a second adhesive member that is positioned more inward than the first adhesive member in front of the substrate and the sealing substrate,
wherein the multi-layered protective layer has a structure in which a first inorganic layer, a first moisture absorbing layer, a second inorganic layer, a second moisture absorbing layer, and a third inorganic layer are stacked in the order named,
wherein a thickness of the moisture absorbing layer is 0.05 μm to 1,000 μm,
wherein the moisture absorbing layer is formed of polyvinyl alcohol or an organic metal compound,
wherein the organic metal compound is a compound expressed by the following formula: M(OR1)a,
wherein M is one of group II, III, and IV elements,
R1 is one of substituted or non-substituted mono-valent chain hydrocarbon group, mono-valent alicyclic hydrocarbon group, and monocyclic or polycyclic mono-valent aromatic or hetero aromatic hydrocarbon group,
"a" is 2 when M is a group II element, "a" is 3 when M is a group III element, and "a" is 4 when M is a group IV element.

7. The OLED display of claim 6, wherein the inorganic layers are formed of one of SiO2, SiOxNy, SiNx, SiOxCy, Al2O3, indium-tin-oxide (ITO), ZnOx, and Al—ZnOx.

8. The OLED display of claim 6, wherein the moisture absorbing layer is formed using one of a dipping method, a spin coating method, a spray coating method, a dispensing method, and a screen printing method.

* * * * *